US012803541B2

(12) United States Patent
Cai et al.

(10) Patent No.: US 12,803,541 B2
(45) Date of Patent: Nov. 17, 2026

(54) MASTER LATCH AND FLIP-FLOP

(71) Applicant: Arm Limited, Cambridge (GB)

(72) Inventors: Yunpeng Cai, Nice (FR); Subramanya Ravindra Shindagikar, Bangalore (IN); Yves Thomas Laplanche, Valbonne (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 18/801,145

(22) Filed: Aug. 12, 2024

(65) Prior Publication Data

US 2026/0045938 A1 Feb. 12, 2026

(51) Int. Cl.
*H03K 3/037* (2006.01)
*H03K 3/012* (2006.01)

(52) U.S. Cl.
CPC ........... *H03K 3/0372* (2013.01); *H03K 3/012* (2013.01)

(58) Field of Classification Search
CPC ............................. H03K 3/0372; H03K 3/012
See application file for complete search history.

(56) References Cited

U.S. PATENT DOCUMENTS 10,038,429 B1 * 7/2018 Narayanan ............. H03K 3/013
11,558,041 B1 * 1/2023 Oklobdzija .......... H03K 3/0372
2016/0094204 A1 * 3/2016 Nandi .................. H03K 3/0372 327/203
2018/0091149 A1 * 3/2018 Kuenemund ........ H03K 3/3562
2023/0208424 A1 * 6/2023 Baksh .................... H03K 3/012

OTHER PUBLICATIONS

Kawai, et al, "A Fully Static Topologically-Compressed 21-Transistor Flip-Flop with 75% Power Saving," IEEE Journal of Solid-State Circuits, vol. 49, Issue 11, DOI: 10.1109/JSSC.2014.2332532, Nov. 2014, Published Jul. 9, 2014, 4 pages.

Cai, et al, "Evaluation and Analysis of Single-Phase Clock Flip-Flops for NTV Applications," 2017 27th International Symposium on Power and Timing Modeling, Optimization and Simulation (PATMOS), Date Added to IEEE Xplore: Nov. 16, 2017, DOI: 10.1109/PATMOS.2017.8106962, Sep. 25-27,2017, 6 pages.

Cai, et al, "Ultra-Low Power 18-Transistor Fully Static Contention-Free Single-Phase Clocked Flip-Flop in 65-nm CMOS," IEEE Journal of Solid-State Circuits, vol. 54, No. 2, Feb. 2019, 10 pages.

Kim, et al, "A Static Contention-Free Single-Phase-Clocked 24T Flip-Flop in 45nm for Low-Power Applications," 2014 IEEE International Solid-State Circuits Conference, ISSCC 2014, Feb. 12, 2014, 3 pages.

* cited by examiner

*Primary Examiner* — Sibin Chen
(74) *Attorney, Agent, or Firm* — Berkeley Law & Technology Group, LLP

(57) ABSTRACT

There is provided a master latch configured to receive a clock signal and comprising: a plurality of transistors, wherein more than one and fewer than four transistors of the plurality of transistors are configured to receive the clock signal. Additionally there is provided a master latch configured to receive a clock signal and comprising: a plurality of transistors, wherein fewer than four transistors of the plurality of transistors are configured to receive the clock signal; and wherein a maximum number of transistors connected in series between a voltage rail adapted for connection to a power supply and an output of the master latch is less than three. Flip-flops comprising the master latches are also described.

16 Claims, 7 Drawing Sheets

MASTER LATCH AND FLIP-FLOP

TECHNICAL FIELD

The present techniques relate to master latches and flip-flops. In particular, the present techniques relate to single-phase clock-connected master latches and single-phase clock flip-flops.

BACKGROUND

Transmission gate flip flops (TGFFs) are widely used in sequential logic electronic designs. TGFFs typically comprise around 24 transistors, 12 of which are connected to a clock signal. As a result, TGFFs suffer from high power consumption and exhibit degraded performance at low voltages, and correspondingly low clock frequencies, due to source-drain leakage in the transmission gates. ATGFF with scan functionality may comprise 32 transistors in total with 12 transistors connected to the clock signal.

A variant of the TGFF, TGFF22, which uses a single inverter as a clock buffer may comprise 22 transistors, 10 of which are connected to the clock signal. Implementing scan functionality in the TGFF22 may increase the transistor count to 30, with 10 transistors connected to the clock signal.

An alternative, the true single-phase clock flip-flop (TSPCFF), relies on a single-phase clock and comprises fewer transistors connected to the clock signal. However, the TSPCFF uses dynamic operation, making it less reliable at low voltages, and is highly sensitive to the clock slope leading to inefficiency.

The topologically compressed flip-flop (TCFF) design comprises still fewer transistors connected to a clock signal and hence the lowest power consumption when inactive. However, the charge sharing scheme employed in the slave latch increases a maximum number of transistors connected in series between a voltage rail adapted for connection to a power supply and an output of the master latch, or stack height. This increased stack height degrades performance at low voltages, making the flip-flop unreliable.

By contrast, the static contention-free single-phase clock flip-flop (S2CFF) avoids the charge sharing issues of the TCFF, but uses a larger number of transistors, including a larger number connected to a clock signal. As a result of this higher device count, area requirement and power consumption of the S2CFF are relatively high.

Another potential drawback of the TCFF and S2CFF is the lack of local clock buffering in the flip-flop which may increase a transition time associated with the clock signal, resulting in degraded and unreliable performance.

The single-phase flip-flop with 18 transistors (18TFF) represents the lowest device count for a contention free, fully static, and single-phase clock flip-flop, having 18 transistors in total including four transistors connected to a clock signal. However, due at least in part to a high stack height between an output of the flip-flop and electrical ground, the 18TFF suffers from increased hold time which can lead to system level inefficiency.

Further information may be found in Y. Kim et al., "27.8 A static contention-free single-phase-clocked 24T flip-flop in 45 nm for low-power applications," 2014 *IEEE International Solid-State Circuits Conference Digest of Technical Papers* (*ISSCC*), San Francisco, CA, 2014, pp. 466-467; N. Kawai et al., "A fully static topologically-compressed 21-transistor flip-flop with 75% power saving," *Solid-State Circuits Conference* (*A-SSCC*), 2013 *IEEE Asian*, Singapore, 2013, pp. 117-120; Y. Cai, et al., "Ultra-Low Power 18-Transistor Fully Static Contention-Free Single-Phase Clocked Flip-Flop in 65-nm CMOS," in *IEEE Journal of Solid-State Circuits*, vol. 54, no. 2, pp. 550-559, Feb. 2019; and Y. Cai, et al. "Evaluation and analysis of single-phase clock flip-flops for NTV applications," in 2017 27*th International Symposium on Power and Timing Modeling, Optimization and Simulation* (*PATMOS*), Thessaloniki, Greece, 2017, IEEE, pp. 1-6.

Accordingly, some flip-flops may experience performance issues, for example, unreliability at low voltages or clock frequencies.

There is a need for mitigation action to address such performance issues.

The present techniques relate to reliable and efficient low voltage tolerant master latches and flip-flops.

SUMMARY

According to a first approach of present techniques, there is provided a master latch configured to receive a clock signal, the master latch comprising: a plurality of transistors, wherein more than one and fewer than four transistors of the plurality of transistors are configured to receive the clock signal.

A transistor configured to receive the clock signal may be described herein as a clock-connected transistor.

In some implementations, exactly three transistors of the plurality of transistors are configured to receive the clock signal.

In some implementations, the clock signal is a single-phase clock signal.

In some implementations, a maximum number of transistors connected in series between a voltage rail adapted for connection to a power supply and an output of the master latch is less than three.

In some implementations, the master latch comprises: a first logic circuit element configured to receive as inputs a data signal and the clock signal; and a second logic circuit element configured to receive as inputs an output signal from the first logic circuit element and the clock signal.

In some implementations, the first logic circuit element and the second logic circuit element each comprise a plurality of transistors; and wherein at least one transistor configured to receive the clock signal is common to both the first and the second logic circuit elements.

In some implementations, the latch is configured to output at least one latch output signal; wherein the at least one latch output signal is at least one of the output signal from the first logic circuit element and an output signal the second logic circuit element.

In some implementations, each of the first and second logic circuit elements comprises one selected from the list: NAND gate; NOR gate; AND-OR-invert gate; OR-AND-invert gate.

In some implementations, at least one of the first and second logic circuit elements is selected from the list: AND-OR-invert gate; OR-AND-invert gate; and is configured to receive as an additional input an asynchronous signal.

In some implementations, the master latch further comprises: a third logic circuit element configured to receive as inputs a latch input signal and an output signal from the second logic circuit element; and a fourth logic circuit element configured to receive as inputs an output signal from the third logic circuit element and an output signal from the first logic circuit element; wherein the fourth logic circuit element is further configured to output the data signal.

In some implementations, each of the third and fourth logic circuit elements comprises one selected from the list: NAND gate; NOR gate.

According to a further approach of present techniques, there is provided a flip-flop comprising the master latch of the first approach.

According to a further approach of present techniques, there is provided a master latch configured to receive a clock signal, the master latch comprising: a plurality of transistors, wherein fewer than four transistors of the plurality of transistors are configured to receive the clock signal; and wherein a maximum number of transistors connected in series between a voltage rail adapted for connection to a power supply and an output of the master latch is less than three.

The maximum number of transistors connected in series between a voltage rail adapted for connection to a power supply and an output of the master latch may be referred to herein as 'stack height'. 'Stack height' may also be used herein to refer to a maximum number of transistors connected in series between electrical ground and an output of the master latch.

According to a further approach of present techniques, there is provided a flip-flop comprising the master latch of the previous approach.

According to a further approach of present techniques, there is provided a master latch configured to: receive a latch input signal and output at least one latch output signal, the latch comprising at least four logic circuit elements: a first logic circuit element configured to receive as inputs a data signal and a clock signal; a second logic circuit element configured to receive as inputs an output signal from the first logic circuit element and the clock signal; a third logic circuit element configured to receive as inputs the latch input signal and an output signal from the second logic circuit element; and a fourth logic circuit element configured to receive as inputs the output signal from the first logic circuit element and an output signal from the third logic circuit element, and further configured to output the data signal; wherein the at least one latch output signal is at least one of the output signal from the first logic circuit element and the output signal from the second logic circuit element.

In some implementations, the first logic circuit element is further configured to receive as an input an asynchronous reset signal operable to reset the latch independently of the clock signal.

According to a further approach of present techniques, there is provided a flip-flop comprising the master latch of the previous approach.

In some implementations, the flip-flop further comprises an input stage comprising a multiplexer configured to select one of at least two signals to supply to the master latch.

In some implementations, the flip-flop further comprises a slave latch configured to receive as input at least one output signal from the master latch.

According to a further approach of present techniques, there is provided a non-transitory computer-readable medium to store computer-readable code for fabrication of the circuitry of the master latch of another approach.

BRIEF DESCRIPTION OF THE DRAWINGS

Implementations of the disclosed technology will now be described, by way of example only, with reference to the accompanying drawings, in which.

DETAILED DESCRIPTION

Figure 1A:
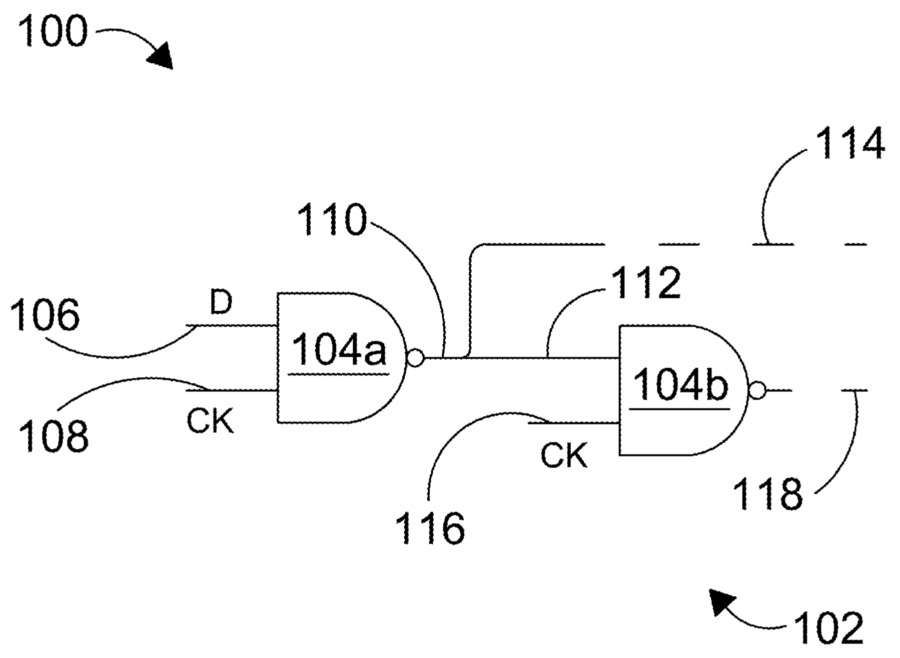
FIG. 1A schematically shows a logic diagram of a portion of a master latch according to an implementation of present techniques.

Digital systems (e.g. central processing unit (CPU), graphics processing unit (GPU)) are, generally sequential and require sequential elements such as flip-flops.

As with many other components in digital systems, flip-flops consume power. A majority of the power consumed is either clock power (power associated with clock toggling i.e. controlling a switch element in response to a clock signal) or data power (power associated with data toggling i.e. controlling a switch element in response to a data signal). Of these, clock power may be generally a greater proportion of power consumption because transistors configured to receive the clock signal switch every clock cycle irrespective of whether data has changed, whereas transistors configured to receive data only switch when the data changes. Therefore clock power consumption may be greater than data power consumption. Further, the power consumption increases as the number of switch elements (e.g. transistors), and associated gate capacitances, of the flip-flops increase. Accordingly, to provide a flip-flop having low power consumption, a reduction in an overall number of switch elements and particularly in a number of switch elements configured to receive the clock signal is desired.

Conventional low power flip-flops comprise reduced numbers of switch elements compared with earlier designs through use of techniques such as topological compression. However, these flip-flops often suffer from severe timing constraints due to increases in stack height resulting from the compression, which may lead to timing violations, errors and glitches. Such issues may be mitigated by adding switch elements to the flip-flop or as accessories to the flip-flop, however such an increase in a number of switch elements may negate any power consumption benefit achieved by the flip-flop when integrated into a system, i.e., at block level.

For reliable and stable circuit operation, timing constraints imposed by physical circuit limitations must be considered during flip-flop design, or flip-flop component, such as master latch, design. Timing considerations are particularly pertinent in very large scale integration (VLSI) design where a flip-flop may be operating as part of a complex and interdependent block level implementation.

Setup time is a timing parameter for flip-flop design which represents the minimum amount of time a data input must be constant, or steady, before a clock event to ensure that the data is reliably sampled at the clock event. The complementary parameter of setup time is hold time; hold time being the minimum amount of time a data input must be constant, or steady, after a clock event to ensure that the data is reliably sampled at the clock event. A data signal that changes during the setup time before a clock event, or the hold time after a clock event, may not be reliably sampled which may introduce errors. Further, in that case, the system may enter a metastable state causing the circuit to act unpredictably or even fail or glitch. Accordingly, a circuit design having an excessive setup time requirement and/or an excessive hold time requirement may be undesirable as it may itself be error or failure prone or may be liable to introduce errors due to timing violations in downstream circuitry.

Insertion delay is the sum of setup time and propagation time, sometimes called clock-to-Q delay, which is the amount of time between a clock event occurring and a change in an output data value. So insertion delay is the minimum amount of time required between a data input becoming steady before a clock event and a data output changing following the clock event for reliable operation. In some circumstances, high insertion delays, often comprising high setup times, can be addressed by adjusting a target frequency of operation, e.g., a clock frequency, or considering implementation of such circuits in applications with relaxed timing constraints. However, hold time issues may not be mitigated in the same way, that is, by adjusting operating frequency without modification of plan area. Instead hold time mitigation may require additional logic or buffers, the addition of which may exacerbate setup time violations. Moreover, such added logic may necessitate an area expansion of the circuit. Accordingly, when a plan area of a chip is fixed and cannot be altered, hold time violations may be very difficult to fix. Consequently, it is important to address hold time issues at the block level to avoid violations that may have severe consequences. In this way, hold time assumes a greater importance at a block level implementation than setup time.

Long hold times may be accommodated by slowing down the propagation of data through a circuit to maintain reliable operation of the circuit. Data propagation may be slowed through the introduction of buffers, e.g., one or more inverters, in the data path. However, introducing additional inverters increases component count, increasing power consumption and area required. That elevated power consumption may eliminate any power savings achieved from using a low power flip-flop and may lead to a negligible reduction in power consumption that is barely discernible at the block level, or even an increase in power consumption being observed.

Accordingly, there is a need for a hold time optimised, single phase flip flop topology which retains desirable ultra-low power characteristics at cell level and block level.

Present techniques provide a master latch and flip-flop scheme designed for contention-free low-voltage operation using a single-phase clock. The scheme may deliver a substantial energy reduction and reduced hold time when compared to existing single-phase flip-flop designs. The improved hold time may allow the benefit of the low power consumption of the scheme to extend to the block level by easing hold time constraints during physical implementation. At the block level, the scheme may demonstrate a reduction in total power consumption while maintaining a comparable timing profile to existing single phase flip-flop designs.

Figure 1B:
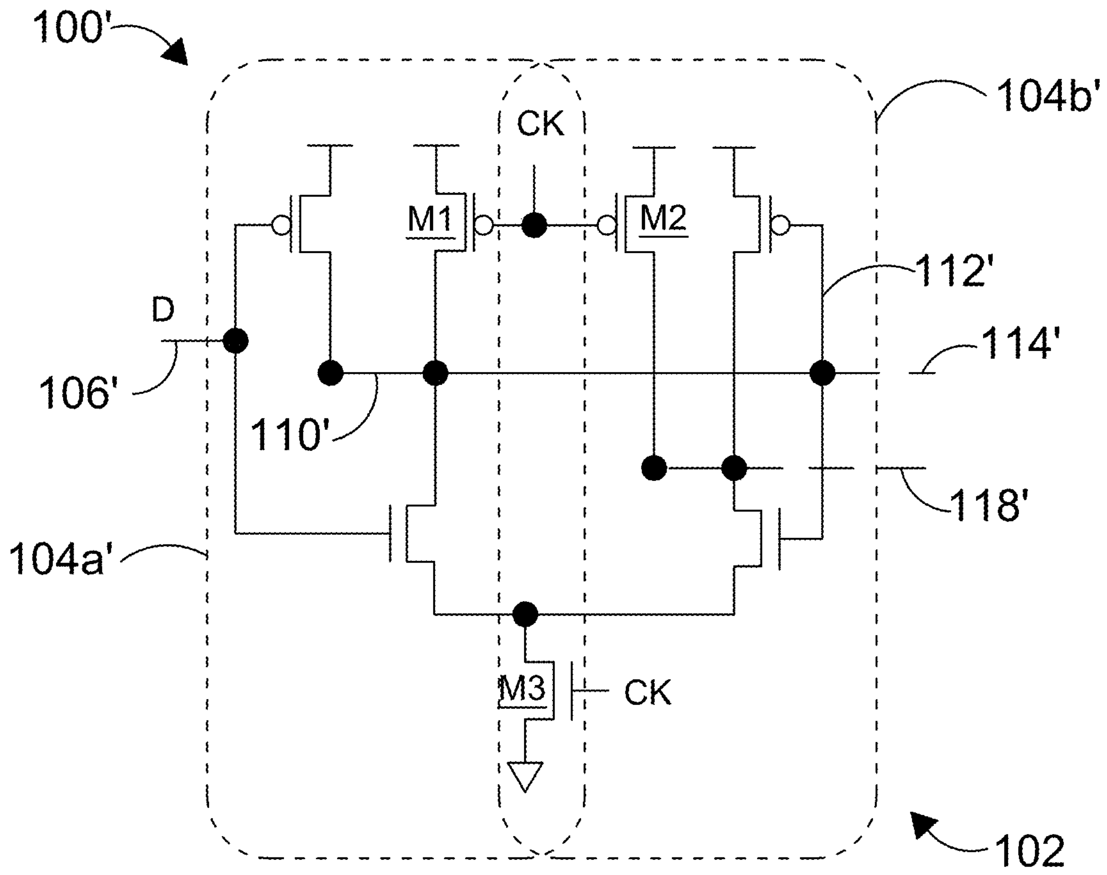
FIG. 1B schematically shows a circuit diagram of the portion of a master latch of FIG. 1A.

With reference to FIGS. 1A and 1B, there is illustrated a schematic logic diagram 100 and a corresponding circuit diagram 100' of a portion of a master latch 102.

As shown in FIG. 1A, the portion of the master latch 102 comprises two NAND gates 104*a*, 104*b*. The first NAND gate 104*a* receives as inputs a data signal, D, at input 106 and a single-phase clock signal, CK, at input 108. The first NAND gate 104*a* output 110 is connected to an input 112 of the second NAND gate 104*b* and may optionally be connected to a further circuit, e.g., a further latch stage, indicated by dashed line 114. The second NAND gate 104*b* also receives as an input the single-phase clock signal, CK, at input 116. The output of the second NAND gate 104*b* is optionally connected to a further circuit, e.g., a further latch stage, indicated by dashed line 118. In practice, either one or both of the output signals 114, 118 from the NAND gates 104*a*, 104*b* may be connected to a further circuit.

In normal operation, when the clock signal, CK, is low, zero, the outputs 114, 118 from the master latch portion 102 are 1. When CK is high, one, the output 114 of the first NAND gate 104*a* is the inverse of D, that is, $\overline{D}$, and the output 118 of the second NAND gate 104*b* is D. In this way, the logic circuit of FIG. 1A is operable as a master latch.

As shown in FIG. 1B, the portion of the master latch 102 comprises seven transistors. The transistors forming the first NAND gate 104*a* are indicated within dashed line 104*a*'. The transistors forming the second NAND gate 104*b* are indicated within dashed line 104*b*'. The first NAND gate 104*a*' receives as inputs a data signal, D, at input 106'. The first NAND gate 104*a*' output 110' is connected to an input 112' of the second NAND gate 104*b*' and may be optionally connected to a further circuit, e.g., a further latch stage, indicated by dashed line 116'. The output of the second NAND gate 104*b*' is optionally connected to a further circuit, e.g., a further latch stage, indicated by dashed line 118'. In practice, either one or both of the output signals 114', 118' from the NAND gates 104*a*', 104*b*' may be connected to a further circuit.

In FIG. 1B, each NAND gate 104*a*', 104*b*', comprises two transistors connected to a clock signal, CK. These transistors are M1, M2 and M3. PMOS transistor M1 and NMOS transistor M3 are part of NAND gate 104*a*'. PMOS transistor M2 and NMOS transistor M3 are part of NAND gate 104*b*'. The two NAND gates 104*a*', 104*b*' share clock connected NMOS transistor, M3. M1 and M2 are connected to a voltage rail adapted for connection to a power supply. M3 is connected to a ground voltage rail. A maximum stack height of each NAND gate may be two as two series connected NMOS transistors connect the output rail to the ground rail.

For the implementations which follow, the switch elements comprise transistors, for example, metal-oxide-semiconductor field effect transistors (MOSFETS), such as NMOS and PMOS transistors. Each transistor may be configured to permit or prevent current to pass between source and drain terminals wherein the current flow is controlled based on, or in response to, a signal (e.g. voltage) applied to a gate terminal. Such signals may be a clock signal or data.

It will be appreciated that in the following examples, when a transistor is “on” or “closed”, current can pass between the source and drain, whilst when a transistor is “off” or “open”, current is prevented from flowing between the source and drain. It will also be understood that other types of transistors (for example, field effect transistors (FETs), bipolar junction transistors (BJTs) etc.) or other types of devices/components may be used as a switch element, and that claimed subject matter is not limited in this respect.

Figure 2A:
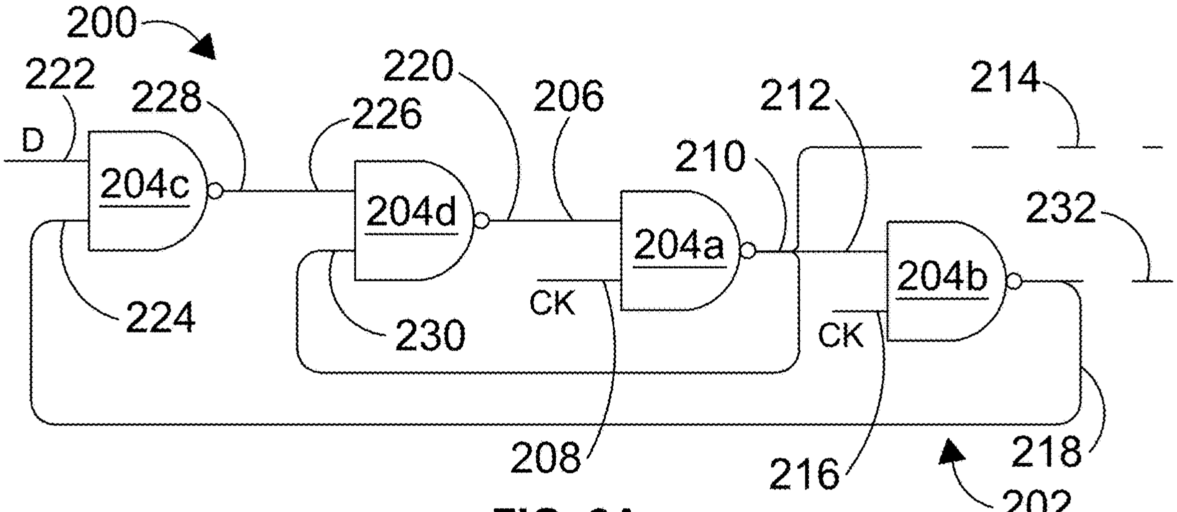
FIG. 2A schematically shows a logic diagram of a master latch according to an implementation of present techniques.
Figure 2B:
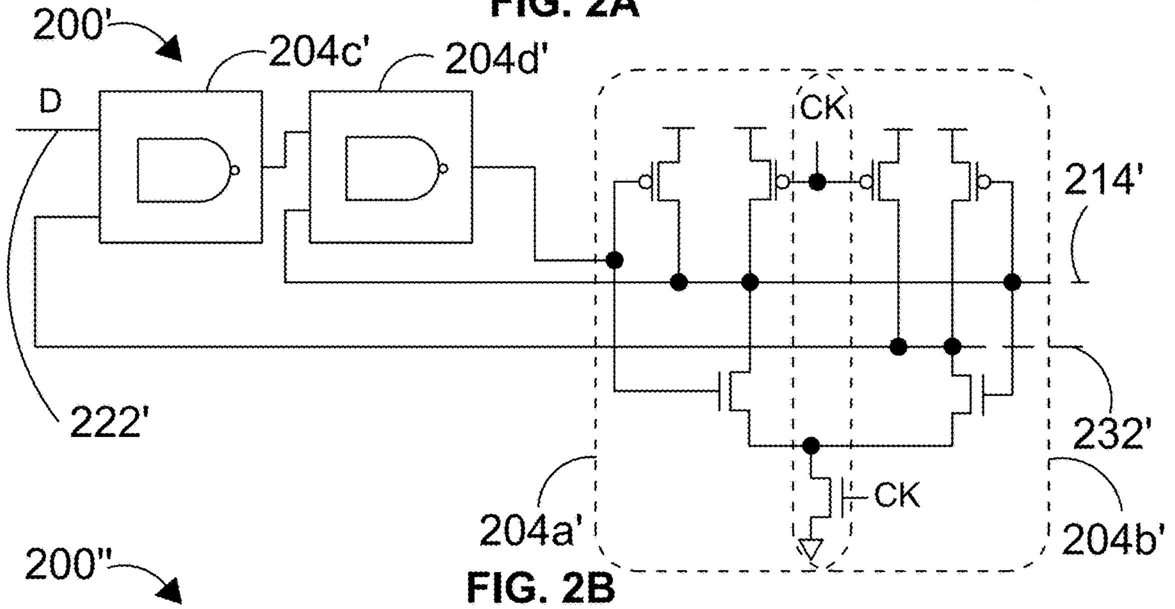
FIG. 2B schematically shows a mixed logic and circuit diagram of the master latch of FIG. 2A.
Figure 2C:
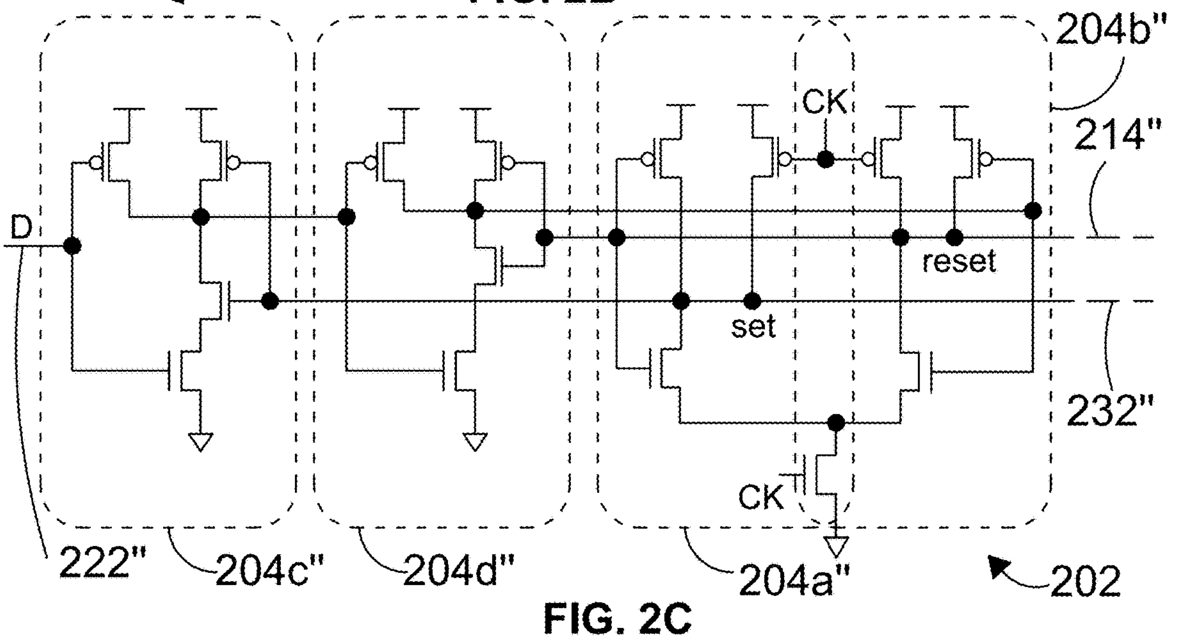
FIG. 2C schematically shows a circuit diagram of the master latch of FIG. 2A.

With reference to FIGS. 2A, 2B and 2C, there is illustrated a schematic logic diagram 200, corresponding mixed logic and circuit diagram 200' and corresponding circuit diagram 200" of a master latch 202.

As shown in FIG. 2A, the master latch 202 comprises four NAND gates 204*a*, 204*b*, 204*c*, 204*d*. Gates 204*a* and 204*b* of FIG. 2A may correspond to gates 104*a* and 104*b* of FIG. 1A.

Input 206 of NAND gate 204*a* is connected to output 220 of NAND gate 204*d* and input 208 of NAND gate 204*a* is connected to a single-phase clock signal, CK. Input 212 of NAND gate 204*b* is connected to output 210 of NAND gate 204*c* and input 216 is connected to a single-phase clock signal, CK. Input 222 of NAND gate 204*c* receives as input a data signal, D, and input 224 of NAND gate 204*c* is connected to output 218 of NAND gate 204*b*. Finally, input 226 of NAND gate 204*d* is connected to output 228 of NAND gate 204*c* and input 230 is connected to output 210 of NAND gate 204*a*.

Output 210 of NAND gate 204*a* may optionally be connected to a further circuit, e.g., a further latch stage, indicated by dashed line 214. Output 218 of NAND gate 204*b* may also optionally be connected to a further circuit, e.g., a further latch stage, indicated by dashed line 232. In practice, either one or both of the output signals 214, 232 from the NAND gates 204*a*, 204*b* may be connected to a further circuit.

The master latch 202 of FIG. 2A operates similarly to the master latch portion of FIG. 1A. That is, in normal operation, when the clock signal, CK, is low, zero, the outputs 214, 232 from the master latch 202 are 1. When CK is high, one, the output 214 of NAND gate 204*a* is the inverse of D, that is, D, and the output 232 of the NAND gate 204*b* is D. In this way, the logic circuit of FIG. 2A is operable as a master latch.

The signal output by output 218 of NAND gate 204*b* may be a set signal, while the signal output by output 210 of NAND gate 204*a* may be a reset signal. The set and reset signals may enable NAND gates 204*c* and 204*d* respectively to pass data from the input to the output. For example, when the set signal is high, NAND gate 204*c* outputs at 228 the inverse of data received at input 222. In the same way, when the reset signal is high, NAND gate 204*d* outputs at 220 the inverse of data received at input 226. In this way, NAND gates 204*c* and 204*d* buffer data signal D and are enabled by the set and reset signals. Initially, the values of set and reset may be 1.

As shown in FIG. 2B, the master latch 202 comprises the portion of the master latch 102 of FIG. 1B. NAND gates 204*a* and 204*b* are indicated by dashed lines 204*a*' and 204*b*'. NAND gates 204*c*' and 204*d*' are shown diagrammatically. As shown in FIG. 2C, NAND gates 204*c* and 204*d*, indicated by dashed lines 204*c*"and 204*d*", are each formed of four transistors, none of which are connected to the clock signal. NAND gates 204*a* and 204*b* are indicated by dashed lines 204*a*"and 204*b*". In both FIGS. 2B and 2C, the input to the master latch, D, is shown at 222' and 222" respectively. Outputs from the master latch are also shown at 214' and 232', and 214" and 232", respectively.

As shown in FIG. 2C, each NAND gate may comprise two parallel connected PMOS transistors connected between a supply voltage rail and an output rail, and two series connected NMOS transistors connected between a ground rail and the output rail. In the case of NAND gates 104*a* and 104*b*, one PMOS and one NMOS transistor may be clock-connected. The two NAND gates 104*a* and 104*b* may share a clock connected NMOS transistor to reduce the number of clock connected transistors from four to three. A maximum stack height of each NAND gate may be two as two series connected NMOS transistors connect the output rail to the ground rail.

Figure 3:
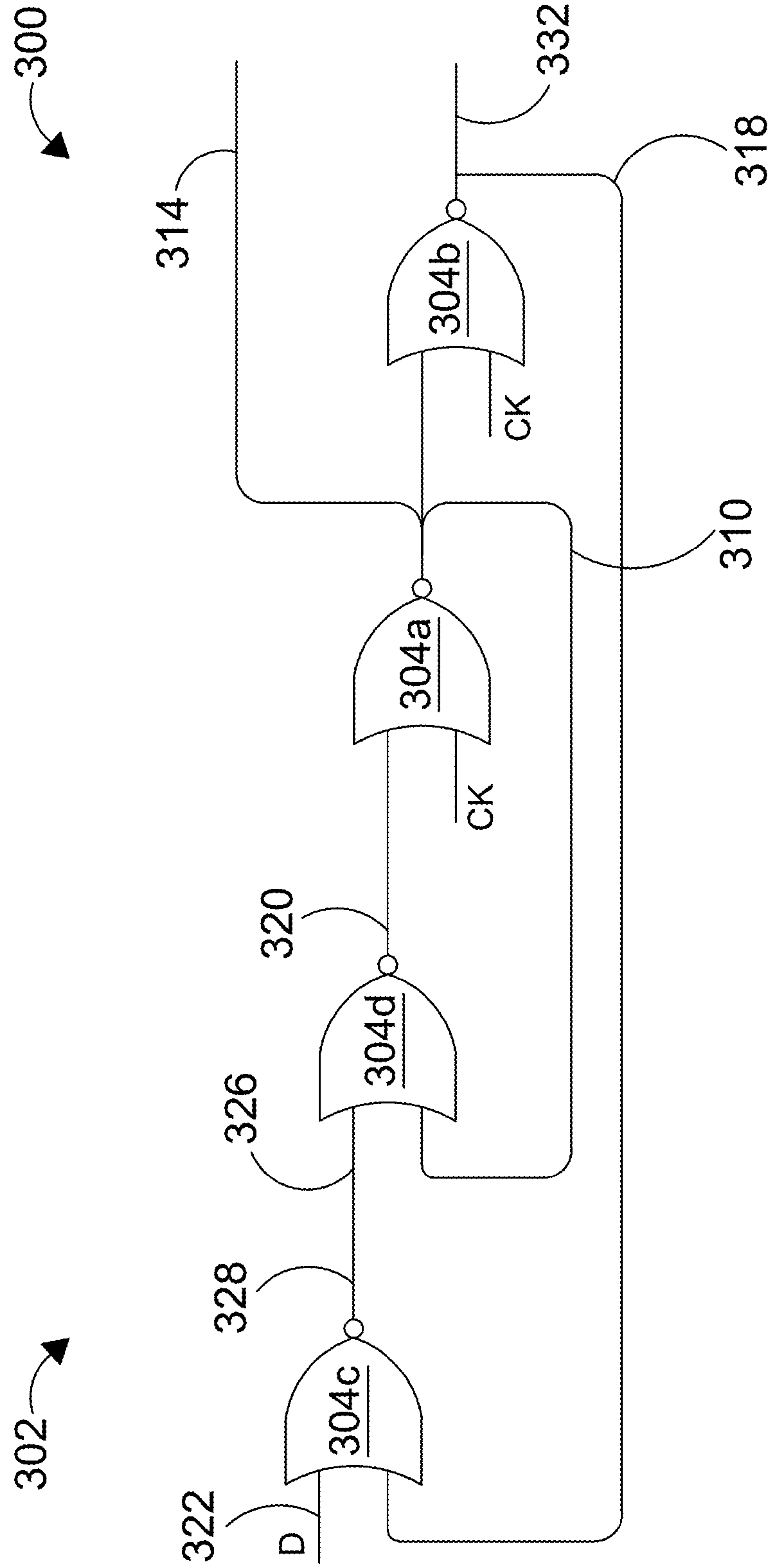
FIG. 3 schematically shows a logic diagram of a master latch according to an implementation of present techniques.

With reference to FIG. 3, there is illustrated an alternative logic diagram 300 of a master latch 302. As shown in FIG. 3, the master latch 302 comprises four NOR gates 304*a*, 304*b*, 304*c*, 304*d*. In this case, the latch is negative edge triggered, that is, in normal operation, when the clock signal, CK, is high, one, the outputs 314, 332 from the master latch 302 are 0. When CK is low, zero, the output 314 of the NOR gate 304*a* is the inverse of D, that is, D, and the output 332 of the NOR gate 304*b* is D. In this way, the logic circuit of FIG. 3 is operable as a master latch.

The signal output by output 318 of NOR gate 304*b* may be a reset signal, while the signal output by output 310 of NOR gate 304*a* may be a set signal. The set and reset signals may enable NOR gates 304*c* and 304*d* respectively to pass data from the input to the output. For example, when the reset signal is low, NOR gate 304*c* outputs at 328 the inverse of data received at input 322. In the same way, when the set signal is low, NOR gate 304*d* outputs at 320 the inverse of data received at input 326. In this way, NOR gates 304*c* and 304*d* buffer data signal D and are enabled by the reset and set signals. Initially, the values of set and reset may be 0.

Each NOR gate may comprise two series connected PMOS transistors connected between a supply voltage rail and an output rail, and two parallel connected NMOS transistors connected between a ground rail and the output rail. In the case of NOR gates 304*a* and 304*b*, one PMOS and one NMOS transistor may be clock-connected. The two NOR gates 304*a* and 304*b* may share a clock connected PMOS transistor to reduce the number of clock connected transistors from four to three. A maximum stack height of each NOR gate may be two as two series connected PMOS transistors connect the output rail to the supply voltage rail.

Figure 4:
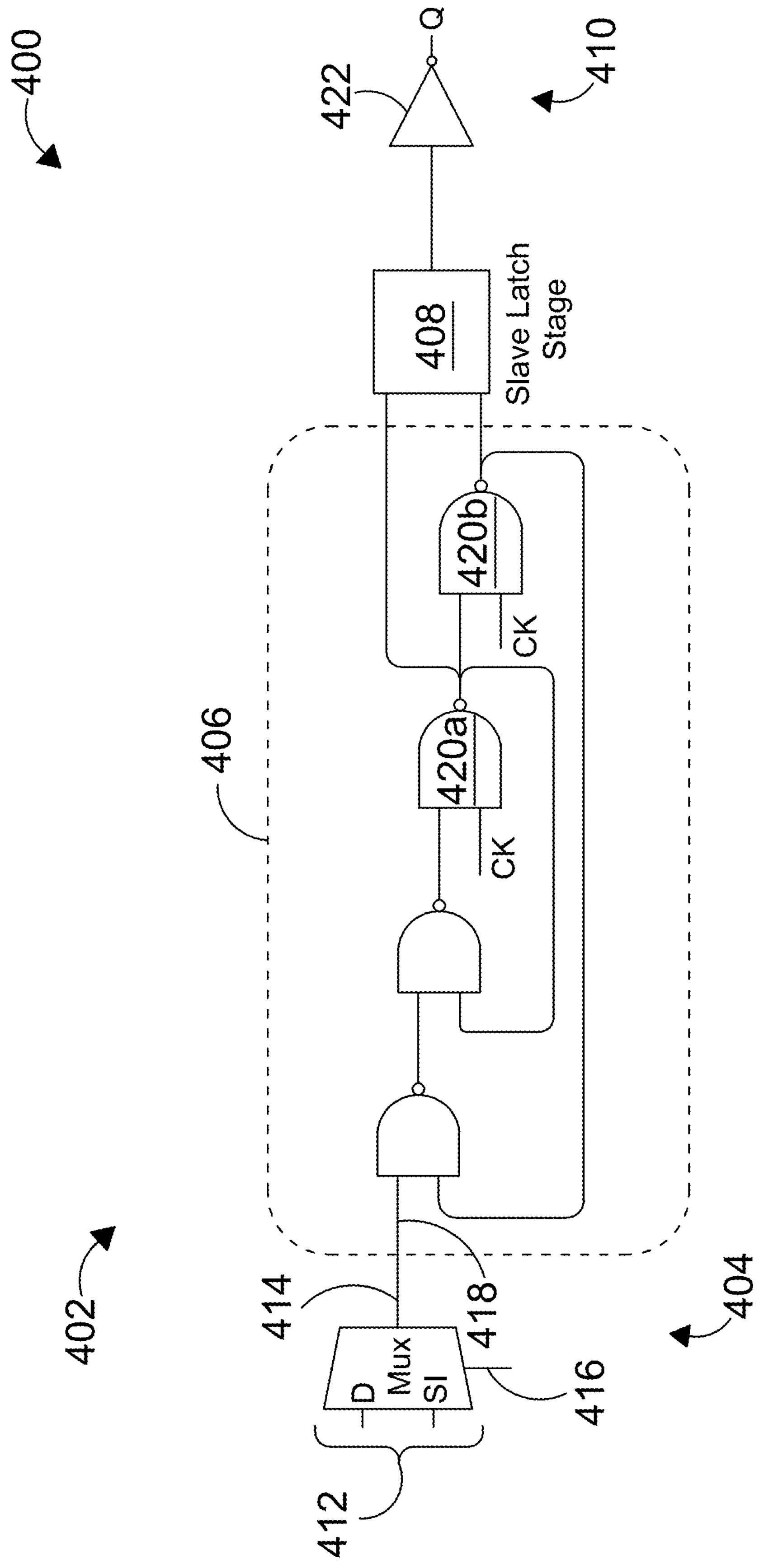
FIG. 4 schematically shows a logic diagram of a flip-flop according to an implementation of present techniques.

With reference to FIG. 4, there is illustrated a logic diagram 400 of a flip-flop 402. The flip-flop 402 comprises an input stage 404, a master latch stage 406, slave latch stage 408 and an output stage 410.

The input stage comprises a multiplexer circuit 404. The multiplexer circuit 404 is configured to receive as inputs at least two data inputs 412, for example a data input, D, and a scan input, SI, and has one output 414. The multiplexer 404 is also configured to receive a scan enable input 416 operable to select one of the inputs to transfer to the output 414. The output 414 of the multiplexer 404 is connected to the input 418 of the master latch 406.

In conventional flip-flop designs, an input scan multiplexer may be integrated into an initial stage of the master latch to conserve area and reduce propagation delay. However, such logic merging techniques are not employed in this embodiment to maintain acceptable hold time constraints. Instead, the input scan multiplexer is provided as an independent input stage. Gate delay inherent to the scan multiplexer allows the multiplexer to provide a useful delay as a data input buffer. In this way, the scan multiplexer may be multifunctional; handling scan-in data, multiplexing input data and buffering input data.

The multiplexer of FIG. 4 may be replaced by any suitable multiplexer topology. Any functional equivalent multiplexer topologies (e.g. Transmission Gate style multiplexer, NAND based multiplexer, AOI21 style multiplexer etc.) may be used as the input scan multiplexer stage. It is recognized that the inherent cell delay of a multiplexer can vary based on its topology, allowing designers to select a suitable multiplexer to meet specific timing design requirements. However, multiplexer selection must be balanced with total transistor count.

The master, or phase 1, latch stage 406 comprises four NAND gates, two of which are configured to receive a clock signal. As discussed above in relation to FIG. 3, four NOR gates may also be used to provide a negative edge triggered flip-flop. The outputs from NAND gates 420*a* and 420*b* are connected to inputs to the slave, or phase 2, latch stage 408. The master latch may be configured to capture the input signal from the multiplexer during a first portion of the clock signal and the slave latch may be configured to capture the master output signal during a second portion of the clock signal. The slave latch may comprise any suitable circuitry. The output from the slave latch stage 408 is connected to an input of the output stage 410. The output stage 410 in FIG. 4 comprises an inverter 422. The output stage is configured to output an output data signal, Q.

The flip-flop 402 uses a single-phase clock and thereby has dynamic operation whereby the output, Q, changes when the clock signal is removed (e.g. clock gating). The rate of such a change will be dependent on, for example, the rate of discharge of voltage/current within the flip-flop. Furthermore, some flip-flops may suffer from contention whereby two or more values or drivers drive the same line/component. In such configurations, additional transistors may be provided to reduce the effects of contention, which may increase the size, capacitance (e.g. gate capacitance) and power consumption of the flip-flop.

Figure 5:
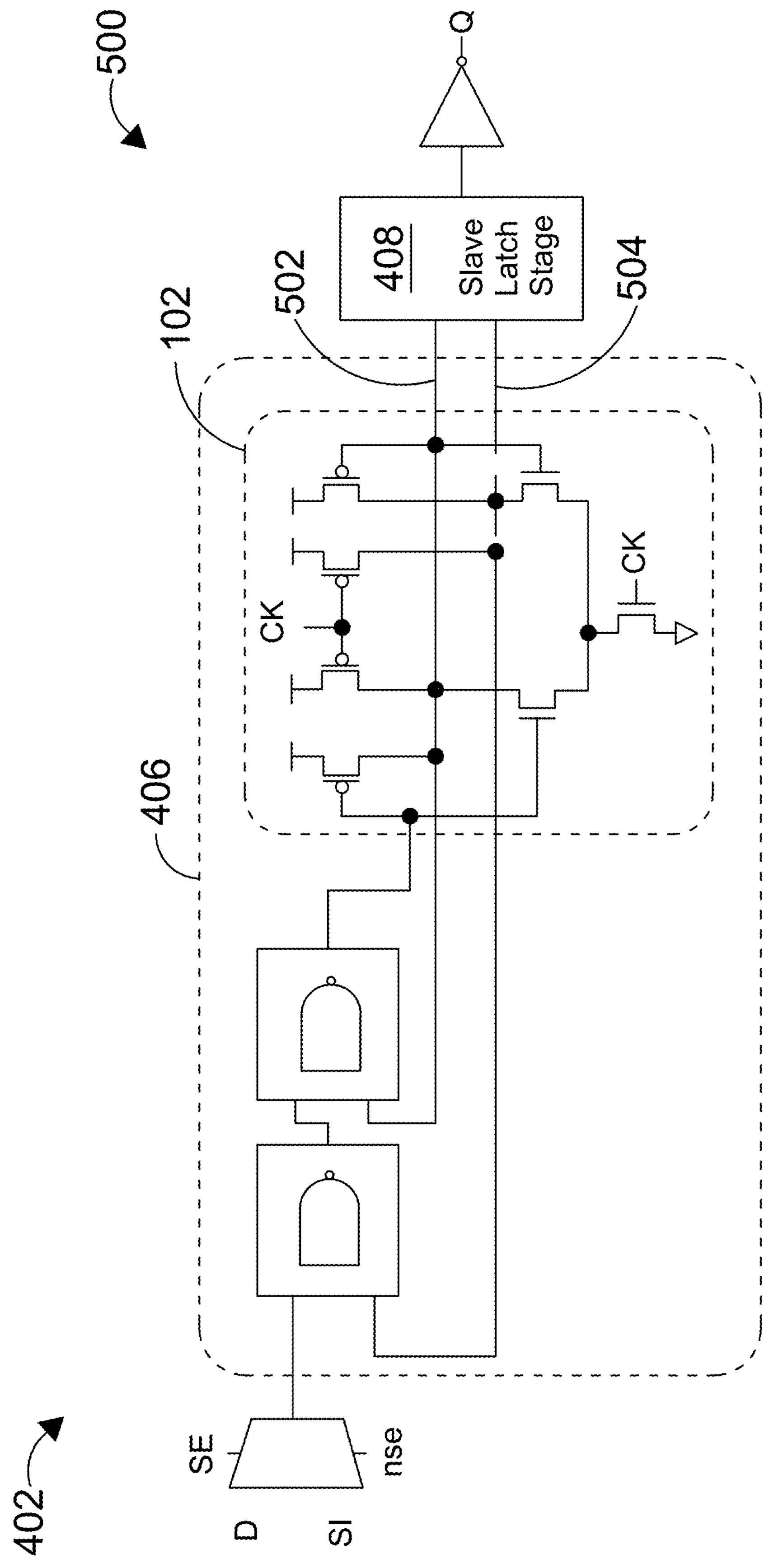
FIG. 5 schematically shows a mixed logic and circuit diagram of the flip-flop of FIG. 4.

With reference to FIG. 5, there is illustrated a mixed logic and circuit diagram 500 of the flip-flop 402 of FIG. 4. The master latch 406 comprises the portion of the master latch 102 of FIG. 1B.

FIG. 5 presents an abstract overview of the flip-flop scheme, highlighting the flexibility of the circuit scheme. Connection of the set/reset nodes 502, 504 to the slave latch stage 408 is contingent on the chosen slave latch topology. For example, both set and reset signals 502, 504 may be linked to the slave latch stage 408, or either the set 504 or reset 502 may be connected to the slave latch stage 408. In the latter case, the slave latch stage 408 may require a clock-connection, e.g., a clock-connected transistor.

Figure 6:
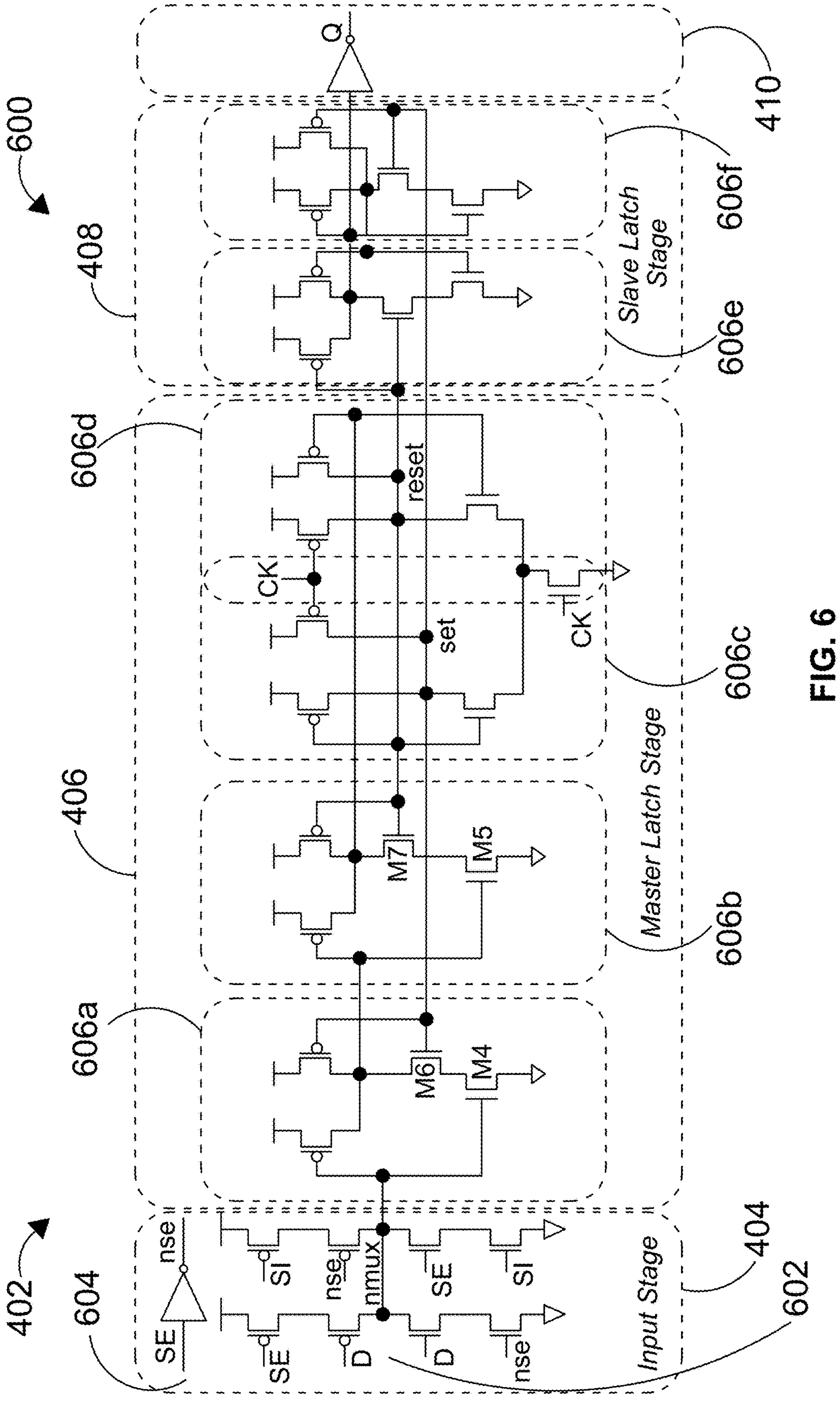
FIG. 6 schematically shows a circuit diagram of the flip-flop of FIG. 4.

With reference to FIG. 6, there is illustrated a circuit diagram 600 of the flip-flop 402 of FIG. 4. The flip-flop 402 comprises an input stage 404, a master latch stage 406, slave latch stage 408 and an output stage 410. FIG. 6 illustrates a scannable single phase clock flip-flop, SSPFFQ. The total transistor count of the flip-flop 402 is 35, each inverter being formed of two transistors, and the number of clock-connected transistors is 3. In this way, clock pin input capacitance is minimised.

The input stage 404 comprising a multiplexer circuit 602 and an inverter 604. The inverter 604 receives a scan enable, SE, signal and inverts the signal to provide an inverted scan enable sign, nse. SE and nse are operable to control the output of the multiplexer 602 between outputting a data signal, D, and a scan input signal, SI. The output of the multiplexer 602, nmux, is connected to the master latch stage 406. The master latch stage 406 is as described above in relation to FIG. 2B.

The master latch stage 406 and slave latch stage 408 together comprise six two-input NAND gates, although other gates, e.g., NOR gates, may be used. Specifically, the master latch stage 406 is constructed of four two-input NAND gates, while the slave latch stage 408 is realized by two two-input NAND gates. Each two-input NAND gate, having two series connected NMOS transistors connected between the output rail and the ground rails, introduces a dynamic aspect to the propagation delay which is contingent upon specific input transitions.

An output signal transition activated by switching the ground-connected transistor, M4, of NAND gate 606*a* forms part of the critical path. By connecting the output of the multiplexer 404 to that transistor, the inherent delay of the NAND gate may be used to amplify a hold time following a clock event to avoid a timing violation. The same strategic technique is replicated with the output of NAND gate 606*a* to the ground connected transistor, M5, of NAND gate 606*b*. In this way, the flip-flop 402 exhibits desirable hold time characteristics.

While adhering to the circuit configuration of FIG. 6 may yield optimal hold time enhancement, it is noted that the basic functionality of the gate is preserved if the order of series connected NMOS transistors M4 and M6 of NAND gate 606*a*, or series connected NMOS transistors M5 and M7 of NAND gate 606*b*, is reversed.

In the case of NAND gates 606*c* and 606*d*, the ground connected, clock connected NMOS transistors of each gate are merged. As a result, the number of clock-connected transistors in the flip-flop 402 is reduced from four to three.

Similarly to NAND gates 606*a*, 606*b* of the master latch stage 406, the slave latch stage 408 comprises two back-to-back connected 2-input NAND gates 606*e*, 606*f*. Traditional designs for slave latches often involve clocked complementary metal oxide semiconductor (C2MOS) or transmission gate based circuit topology, primarily because the slave latch of a conventional flip-flop relies on the transition of the clock (or internal clock) for controlling data flow. However, in FIG. 6, the temporal characteristic is inherently embedded within NAND gates 606*c*, 606*d*, 606*e*, 606*f*. Consequently, in this embodiment, the clock signal is not an input to the slave latch 408. Accordingly, the slave latch comprises zero clock-connected transistors.

Alternative slave latch topologies, including but not limited to a transmission gate based latch, a C2MOS latch or another single phase clock latch may also be used with the master latch of the present technique if polarity aligned with the input stage. If an alternative latch topology is selected, one or more clock connected transistors may be required in the slave latch, leading to an increase in the total clock transistor count.

It will be appreciated that flip-flop 402 does not suffer contention, and, therefore, provides a fully-static, contention free operation. As described above, reducing the number of transistors in the flip-flop may, in turn, reduce the size, power consumption and capacitance of flip-flop 402. Furthermore, the reduced transistor count and reduced clock-connected transistor count for the flip-flop 402 provides for a reduced capacitance and corresponding chip size in comparison to the other low power flip-flops.

Figure 7:
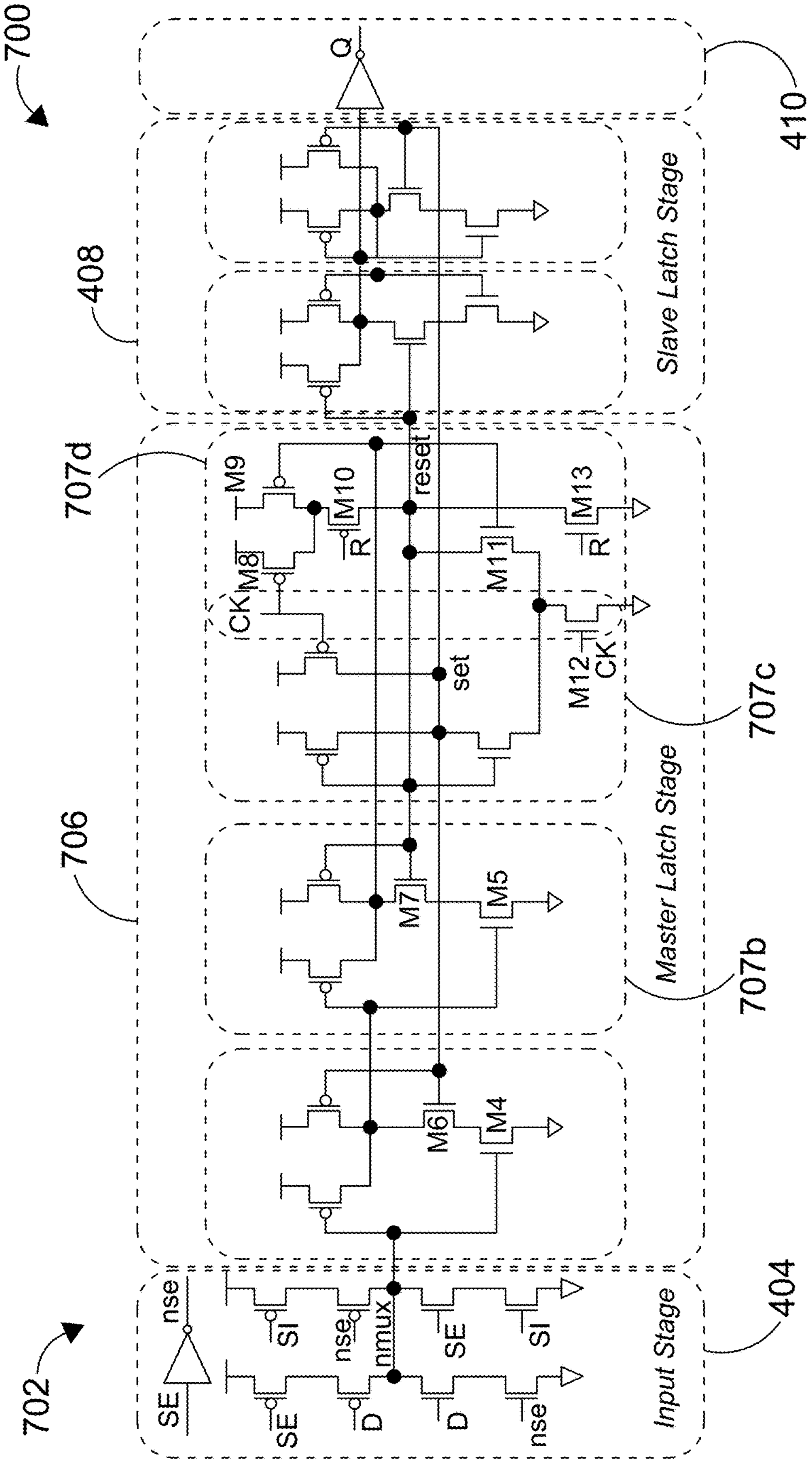
FIG. 7 schematically shows a circuit diagram of a flip-flop according to an implementation of present techniques.

With reference to FIG. 7, there is illustrated a circuit diagram 700 of a flip-flop 702. Like the flip-flop 402 of FIG. 6, the flip-flop 702 of FIG. 7 comprises an input stage 404, a master latch stage 706, slave latch stage 408 and an output stage 410. Where components of the flip-flop 702 od FIG. 7 correspond with components of the flip-flop 402 of FIG. 6, like reference numerals are used.

FIG. 7 illustrates a scannable single phase clock flip-flop with asynchronous reset functionality, SSPFFRPQ. The total transistor count of the flip-flop 702 is 37, each inverter being formed of two transistors, and the number of clock-connected transistors is 3. In this way, clock pin input capacitance is minimised while an asynchronous reset function is provided.

The master latch 706 of FIG. 7 differs from the master latch 406 of FIG. 6 in that one NAND gate is replaced by an AND-OR-invert (AOI) gate 707*d*. That gate comprises two parallel connected PMOS transistors M8, M9 in series with a further PMOS transistor M10 connected between the output rail and the supply rail, and two series connected NMOS transistors M11, M12 in parallel with a further NMOS transistor M13 connected between the output rail and the ground rail.

Additional transistors M10 and M13 are configured to receive an asynchronous reset signal, R, while M9 and M11 are configured to receive an output signal from NAND gate 707*b* and M8 and M12 are configured to receive as inputs the clock signal. The output of AOI gate 707*d*, itself a reset signal, is connected to an input of NAND gates 707*c* and 707*b*, as well as to an input of the slave latch 408. Ground connected and clock-connected transistor M12 is shared between AOI gate 707*d* and NAND gate 707*c* to further reduce the number of clock-connected transistors in the flip-flop 702.

While flip-flop 702 of FIG. 7 comprises more transistors than flip-flop 402 of FIG. 6 due to replacement of NAND gate 606*d* with AOI gate 707*d*, a stack height of the flip-flop is maintained. That is, the maximum number of transistors connected in series between either a voltage rail adapted for connection to a power supply or a ground rail and an output of the master latch is less than three. Accordingly, charge sharing issues are avoided by the flip-flop 702 or FIG. 7.

The NAND-based latch topology of the flip-flop 402 of FIG. 6 allows an asynchronous reset function to be implemented by transforming a NAND gate 606*d* into an AOI gate 707*d* to provide the flip-flop 702 of FIG. 7. As demonstrated in FIG. 7, an additional 2 transistors are required to integrate the asynchronous reset function into the SSPFFQ design.

The reset signal may be provided by any suitable source. For example, the reset signal, R, may come from a power management unit following a power event on an associated processer, whereby after power-up the flip-flops are desired to be in a known state (e.g. 0). In other examples, the reset signal, R, may be generated by another flip-flop (e.g. in a sequential design).

The flip-flop 402 of FIG. 6 may alternatively be modified to introduce asynchronous set functionality by transforming a NAND gate 606*c* into an AOI gate. In that case, that gate may comprise the structure of AOI gate 707*d* shown in FIG. 7; having two additional transistors configured to receive an asynchronous set signal, S. In further embodiments, both asynchronous set and reset functionality may be provided by transforming both NAND gate 606*c* and NAND gate 606*d* of FIG. 6 into AOI gates. In that case, both AOI gates may comprise the additional transistor structure of AOI gate 707*d* shown in FIG. 7, i.e., each gate may comprise two additional transistors configured to receive asynchronous set or reset signals respectively.

In a further embodiment in line with FIG. 3, where the master and slave latches comprise six NOR gates, either or both of NOR gates 304*a* and 304*b* may be replaced with OR-AND-invert, OAI, gates to provide a negative edge triggered flip-flop with asynchronous set and/or reset functionality.

The flip-flops of present techniques may be adapted to form a multi-bit flip-flop by parallel duplication of the flip-flop to provide capacity for additional bits. The low clock input capacitance benefit may be extended to the multibit version as, compared to the 2-bit TGFF22 cell which comprises 10 clock-connected transistors, a 2-bit version embodiment of the flip-flop of FIG. 6 or FIG. 7 would comprise only 6 clock-connected transistors.

The flip-flops of present techniques may achieve a significant reduction in clock input capacitance when compared with the TGFF22 design due primarily to a significant decrease in clock transistors. Conventional flip-flops that have low numbers of clock-connected transistors generally use a two-phase clock that requires built-in inverters which increase the dynamic energy consumption of the flip-flop. Accordingly, the implementation of single-phase clock operation in the flip-flops of present techniques may reduce total energy consumption compared to TGFF22, under equivalent conditions.

In contrast to the 18TFF, the flip-flops of present techniques may mitigate the hold time penalty to a manageable level. Additionally, the flip-flops of present techniques may demonstrate an improvement in insertion delay compared to the TGFF22.

Thus, the flip-flops of present techniques may exhibit comparable timing characteristics and improved energy efficiency when compared with conventional flip-flop designs, all within the constraints of the considered area overhead. The hold time improvement not only assures energy efficiency benefits at the cell level but also extends these advantages to the block level. At that level, the flip-flops of present techniques may demonstrate a reduction in total power consumption while maintaining a comparable timing profile to existing flip-flop designs.

Whilst the example configurations set out above generally relate to D-type flip-flops, the claimed subject matter is not limited in this regard and one skilled in the art will recognize that the techniques are equally applicable to other types of flip-flops such as JK flip-flops.

As will be appreciated by one skilled in the art, the present technology may be embodied as a circuit or a computer readable medium comprising data and imperatives to cause construction of a circuit. Accordingly, the present technology may take the form of an entirely hardware embodiment, an entirely software embodiment, or an embodiment combining software and hardware. Where the word "component" is used, it will be understood by one of ordinary skill in the art to refer to any portion of any of the above embodiments.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define an HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally, or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying present techniques. Alternatively, or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying present techniques. Alternatively, or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

Herein, the words “configured to.” are used to mean that an element of an apparatus has a configuration able to carry out the defined operation. In this context, a “configuration” means an arrangement or manner of interconnection of hardware or software. For example, the apparatus may have dedicated hardware which provides the defined operation, or a processor or other processing device may be programmed to perform the function. “Configured to” does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes and modifications can be effected therein by one skilled in the art without departing from the scope of the present techniques as defined by the appended claims.

What is claimed is:

1. A master latch configured to receive a clock signal, the master latch comprising:

a first logic circuit element configured to receive as inputs a data signal and the clock signal; and a second logic circuit element configured to receive as inputs an output signal from the first logic circuit element and the clock signal, wherein:

the first logic circuit element and second logic circuit element include a plurality of transistors;

each of the first and second logic circuit elements comprises a NAND gate; a NOR gate; an AND-OR-invert gate; or an OR-AND-invert gate;

more than one and fewer than four transistors of the plurality of transistors are configured to receive the clock signal; and at least one transistor of the transistors configured to receive the clock signal is common to both the first and the second logic circuit elements.

2. The master latch of claim 1, wherein exactly three transistors of the plurality of transistors are configured to receive the clock signal.

3. The master latch of claim 1, wherein the clock signal is a single-phase clock signal.

4. The master latch of claim 1, wherein a maximum number of transistors connected in series between a voltage rail adapted for connection to a power supply and an output of the master latch is less than three.

5. The master latch of claim 1, wherein the master latch is configured to output at least one latch output signal; wherein the at least one latch output signal is at least one of the output signal from the first logic circuit element and an output signal the second logic circuit element.

6. The master latch of claim 1, wherein at least one of the first and second logic circuit elements comprises a AND-OR-invert gate or an OR-AND-invert gate; and is configured to receive as an additional input an asynchronous signal.

7. The master latch of claim 1, further comprising:

a third logic circuit element configured to receive as inputs a latch input signal and an output signal from the second logic circuit element; and a fourth logic circuit element configured to receive as inputs an output signal from the third logic circuit element and an output signal from the first logic circuit element;

wherein the fourth logic circuit element is further configured to output the data signal.

8. The master latch of claim 7, wherein each of the third and fourth logic circuit elements comprises a NAND gate or a NOR gate.

9. A flip-flop circuit comprising the master latch of claim 1.

10. A non-transitory computer-readable medium to store computer-readable code for fabrication of circuitry of the master latch of claim 1.

11. A master latch configured to:

receive a latch input signal and output at least one latch output signal, the master latch comprising at least four logic circuit elements:

a first logic circuit element configured to receive as inputs a data signal and a clock signal;

a second logic circuit element configured to receive as inputs an output signal from the first logic circuit element and the clock signal;

a third logic circuit element configured to receive as inputs the latch input signal and an output signal from the second logic circuit element; and a fourth logic circuit element configured to receive as inputs the output signal from the first logic circuit element and an output signal from the third logic circuit element, and further configured to output the data signal;

wherein the at least one latch output signal is at least one of the output signal from the first logic circuit element and the output signal from the second logic circuit element.

12. The master latch of claim 11, wherein the first logic circuit element is further configured to receive as an input an asynchronous reset signal operable to reset the master latch independently of the clock signal.

13. A flip-flop circuit comprising the master latch of claim 11.

14. The flip-flop circuit of claim 13, further comprising an input stage comprising a multiplexer configured to select one of at least two signals to supply to the master latch.

15. The flip-flop circuit of claim 13, further comprising a slave latch configured to receive as input at least one output signal from the master latch.

16. A master latch configured to receive a clock signal, the master latch comprising:

a first logic circuit element configured to receive as inputs a data signal and the clock signal; and a second logic circuit element configured to receive as inputs an output signal from the first logic circuit element and the clock signal;

wherein:

the first logic circuit element and second logic circuit element include a plurality of transistors;

exactly three transistors of the plurality of transistors are configured to receive the clock signal; and at least one transistor of the transistors configured to receive the clock signal is common to both the first and the second logic circuit elements.

* * * * *